(12) United States Patent
Xi et al.

(10) Patent No.: US 9,741,744 B2
(45) Date of Patent: Aug. 22, 2017

(54) ARRAY SUBSTRATE, METHOD FOR MANUFACTURING THE SAME, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yusheng Xi, Beijing (CN); Bin Feng, Beijing (CN); Jiarong Liu, Beijing (CN); Hongtao Lin, Beijing (CN); Zhangtao Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 294 days.

(21) Appl. No.: 14/379,231

(22) PCT Filed: Dec. 11, 2013

(86) PCT No.: PCT/CN2013/089141
§ 371 (c)(1),
(2) Date: Aug. 15, 2014

(87) PCT Pub. No.: WO2014/173138
PCT Pub. Date: Oct. 30, 2014

(65) Prior Publication Data
US 2016/0141305 A1    May 19, 2016

(30) Foreign Application Priority Data

Apr. 27, 2013    (CN) .......................... 2013 1 0152384

(51) Int. Cl.
*H01L 27/13*    (2006.01)
*H01L 27/12*    (2006.01)
(Continued)

(52) U.S. Cl.
CPC .......... *H01L 27/124* (2013.01); *G02F 1/1368* (2013.01); *H01L 27/1259* (2013.01); *H01L 29/45* (2013.01)

(58) Field of Classification Search
CPC .......................... H01L 27/124; H01L 27/1244
See application file for complete search history.

(56) References Cited

U.S. PATENT DOCUMENTS

2007/0279543 A1* 12/2007 Park .................. G02F 1/136204
                                                                    349/40
2010/0109993 A1    5/2010 Chang
2011/0234568 A1*  9/2011 Izumida .............. H01L 27/0288
                                                                    345/211

FOREIGN PATENT DOCUMENTS

CN        101515587 A    8/2009
CN        101661198 A    3/2010
(Continued)

OTHER PUBLICATIONS

First Chinese Office Action Appln. No. 201310152384.4; Dated Feb. 28, 2015.
(Continued)

*Primary Examiner* — Raj R Gupta
(74) *Attorney, Agent, or Firm* — Ladas & Parry LLP

(57) ABSTRACT

An array substrate comprises a TFT, a data line, a gate line and a passivation layer covering the TFT, the data line and the gate line. The array substrate further includes a first conductive structure and a second conductive structure connected with the first conductive structure, the first conductive structure is disposed on the passivation layer and above the TFT, and the second conductive structure is disposed on the passivation layer and above the data line and/or gate line. A method for manufacturing the array substrate and a display device having such an array substrate are also provided.

16 Claims, 2 Drawing Sheets

(51) Int. Cl.
G02F 1/1368 (2006.01)
H01L 29/45 (2006.01)

(56) References Cited

FOREIGN PATENT DOCUMENTS

CN 102237017 A 11/2011
CN 103246099 A 8/2013

OTHER PUBLICATIONS

International Search Report Appln. No. PCT/CN2013/089141; Dated Mar. 11, 2014.
Third Chinese Office Action dated Feb. 29, 2016; Appln. No. 201310152384.4.
Written Opinion of the International Searching Authority mailed Mar. 20, 2014; PCT/CN2013/089141.
Second Chinese Office Action dated Sep. 25, 2015; Appln. No. 201310152384.4.
International Preliminary Report on Patentability issued Oct. 27, 2015; PCT/CN2013/089141.

* cited by examiner

ARRAY SUBSTRATE, METHOD FOR MANUFACTURING THE SAME, AND DISPLAY DEVICE

TECHNICAL FIELD

Embodiments of the present disclosure relate to an array substrate and a method for manufacturing the same, and also relate to a display device having such an array substrate.

BACKGROUND

In current great-size display panels, in order to reduce deformation of the panel, a spacer is often provided between the two substrates, and generally, in order to avoid the displacement of the spacer, for example, in a liquid crystal panel, the spacer at the side of the color film substrate presses against the thin film transistor at the side of the array substrate.

As illustrated in FIG. 1, when the panel is subject to external forces, such as shocks or impacts, the spacer 4 and a passivation layer 3 in the array substrate will abrade with each other and electrostatic charges (often being positive charges) are generated, thus forming an electric field which causes charges (often being electrons) to accumulate in the channel of the TFT, resulting in conduction between the source electrode 2 and the drain electrode 1. When the gate electrode of the TFT is at a low voltage and the TFT is shut down, the source electrode 2 is disconnected from the drain electrode 1. But if the charges accumulated in the channel of the TFT are enough to conduct the source electrode 2 and the drain electrode 1, the drain electrode 1 will supply power to the pixel electrode 5, such that an unstable press spot is generated in the panel when displaying a black picture, producing defects in display of the panel.

FIG. 2 is an equivalent schematic view illustrating formation of the press spot, wherein the dashed line indicates the conduction path between the source electrode S and the drain electrode D formed due to the abrasion between the spacer and the passivation layer. When the voltage across the gate electrode G and the source electrode S is smaller than a threshold voltage, the source electrode S should be disconnected from the drain electrode D, but as illustrated in this Fig, due to effect of the accumulated charges, the source electrode S is conducted with the drain electrode D, and the capacitor Cst is charged.

SUMMARY

One of the objects of embodiments of the present disclosure is to provide an array substrate which is capable of avoiding the forming of the press spot due to the abrasion between the spacer and the TFT, a method for manufacturing the array substrate and a display device having such an array substrate.

According to one aspect of the present disclosure, embodiments of the present disclosure provide an array substrate, comprising: a TFT, a data line, a gate line, and a passivation layer covering the TFT, the data line and the gate line on the substrate. The TFT comprising a gate electrode, a source electrode and a drain electrode, the data line connected with the source electrode of the TFT, and the gate line connected with the gate electrode of the TFT;

the array substrate further comprising a first conductive structure and a second conductive structure connected to the first conductive structure.

the first conductive structure disposed on the passivation layer and above the TFT, the second conductive structure disposed on the passivation layer and above the data line and/or gate line.

The array substrate further comprises a pixel electrode provided in such way that the pixel electrode is isolated from the first conductive structure and the second conductive structure and is connected to the drain electrode of the TFT.

According to one embodiment of the present disclosure, the first conductive structure and the second conductive structure are made of the same conductive material as the pixel electrode.

According to one embodiment of the present disclosure, each of the first conductive structure, the second conductive structure and the pixel electrode are of ITO.

Embodiments of the present disclosure further provide a display device comprising the above array substrate which is capable of achieving the above objects of the embodiments of the present disclosure.

The display device further comprises an opposite substrate provided opposing to the array substrate and a spacer provided between the opposite substrate and the array substrate.

At least one portion of the spacer is in contact with the first conductive structure.

According to another aspect of the present disclosure, embodiments of the present disclosure provide a method for manufacturing the array substrate described above, the method comprising forming patterns of a TFT, a data line, a gate line and a passivation layer on a base substrate, the manufacturing method further comprising:

Step 1: forming a pattern of the first conductive structure on the passivation layer and above the TFT, and forming a pattern of the second conductive structure on the passivation layer and above the data line and/or the gate line, wherein the first conductive structure is connected with the second conductive structure.

For example, the step S comprises:

Step 101: depositing a layer of conductive material on the passivation layer;

Step 102: by means of patterning processes, forming a pattern of the first conductive structure by using the conductive material above the TFT and forming a pattern of the second conductive structure by using the conductive material above the data line and/or gate line.

Further, while the step 102 is performed, a pattern of the pixel electrode is also formed on the conductive material, wherein the pixel electrode is provided so that the pixel electrode is isolated from the first conductive structure and the second conductive structure.

For example, the conductive material deposited in the step 101 is ITO.

In the array substrate and its manufacturing method, as well as the display device comprising such an array substrate as provided by the embodiments of the present disclosure, by providing a first conductive structure and a second conductive structure connected with the first conductive structure in the conventional array substrate, the charges generated due to the abrasion between the spacer and the array substrate can be discharged through a release circuit formed by the first conductive structure and the second conductive structure, thus an electrostatic field is prevented from being generated in the channel of the TFT, and there will be not enough charges accumulated in the channel, and therefore, when the TFT is shut down, the press spot due to conduction between the source and drain electrode will not be formed.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
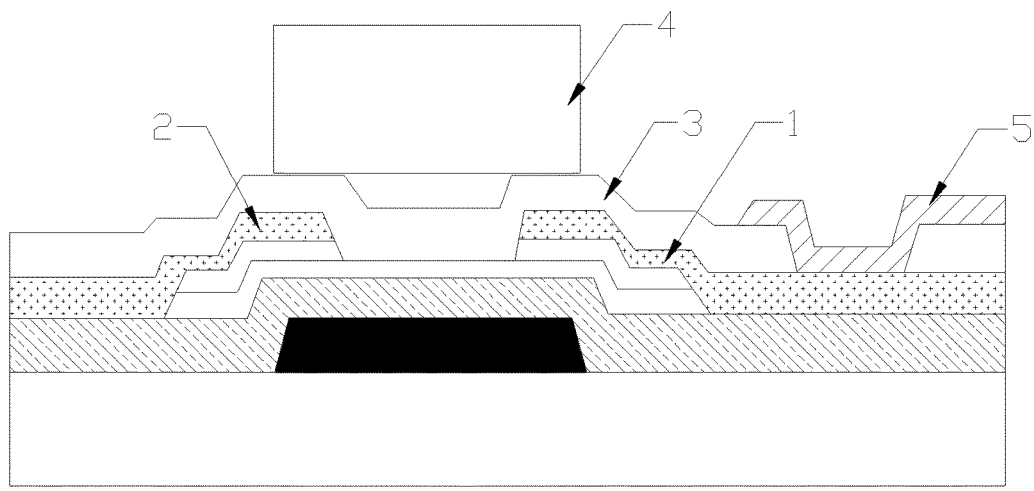
FIG. 1 is a schematic structural view of a conventional array substrate in contact with a spacer.
Figure 2:
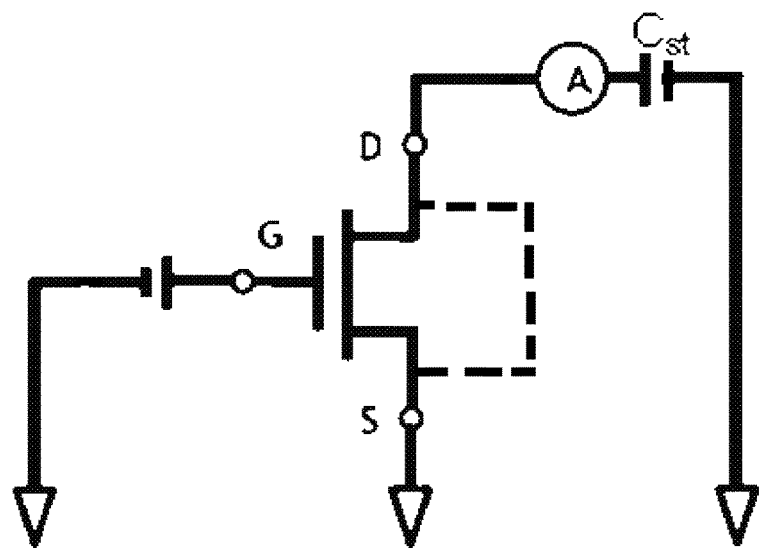
FIG. 2 is an equivalent principle view illustrating how the press spot is generated.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

First Embodiment

In order to overcome the press spot in conventional arts, the present embodiment provides an array substrate 100, the array substrate 100 comprises a TFT 10, a data line 18, a gate line 19, and a passivation layer 13 covering the TFT 100, the data line 18, and the gate line 19, the TFT 10 comprising a gate electrode 14, a source electrode 12 and a drain electrode 11, the data line 18 is connected with the source electrode 12 of the TFT 10, the gate line 19 is connected with the gate electrode 14 of the TFT 10. The array substrate 100 further comprises a first conductive structure 16 and a second conductive structure 17 connected with the first conductive structure.

The first conductive structure 16 is disposed on the passivation layer 13 and above the TFT 10; and the second conductive structure 17 is disposed on the passivation layer 13 and above the data line 18 and/or the gate line 19.

The TFTs in the array substrate is arranged into a TFT matrix, and at least a portion of the first conductive structure 16 is disposed on the passivation layer 13 and above the TFT. The data line 18 and the gate line 19 each are in plural and arranged in a grid. At least a portion of the second conductive structure 17 is disposed on the passivation layer 13 and above the data line 18 and/or gate line 19.

The array substrate further comprises a pixel electrode 15, the pixel electrode 15 is arranged and isolated from the first conductive structure 16 and the second conductive structure 17.

The TFT comprises a gate electrode 14, a source electrode 12 and a drain electrode 11; the gate electrode 14 is electrically connected to the gate line 19, the source electrode 12 is electrically connected to the data line 18, and the drain electrode 11 is electrically connected to the pixel electrode 15 on the array substrate. The TFT is turned on or off depending on whether or not the gate line 19 supplies power to the gate electrode 14, the power is supplied to the pixel electrode 15 through the data line 18 from the source electrode 12 of the TFT to the drain electrode 11, and thus controlling display of the display panel. In the present embodiment, the array substrate further comprises a first conductive structure 16 and a second conductive structure 17, the first conductive structure 16 can discharge the charges generated due to abrasion between the array substrate and the spacer through the second conductive structure 17 in time, and thus preventing charges from accumulating in the channel of the TFT and forming an electrostatic field at the channel of the TFT. Otherwise, sufficient charges will accumulate in the channel and result in conduction between the source electrode 12 and the drain electrode 11 without the control of the gate electrode 14, and generate a press spot.

The second conductive structure can be provided above the gate line, and also can be provided above the data line, and can also be provided above both the gate line and the data line. Such arrangement not only functions to discharge the charges generated due to abrasion between the spacer and the array substrate, but also avoids interference to the pixel electrode.

The array substrate according to the present embodiment can be used widely, for example, in a liquid crystal panel having parallel field mode (IPS, FFS), VA mode and so on, and also in an OLED display panel with cell structure.

Second Embodiment

Figure 3:
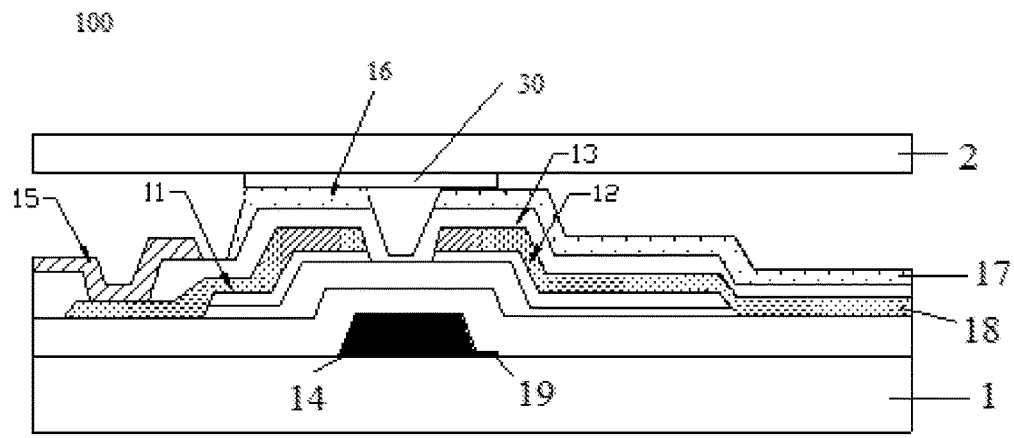
FIG. 3 is a partial side view illustrating the array substrate according to the present disclosure.

As illustrated in FIG. 3, the array substrate according to the present embodiment comprise a TFT, a data line, a gate line and a passivation layer covering above the TFT, the data line and the gate line. The array substrate further comprises a first conductive structure 16 and a second conductive structure 17 connected with the first conductive structure 16.

The first conductive structure 16 is disposed on the passivation layer 13 and above the TFT, the second conductive structure 17 is disposed on the passivation layer 13 and above the data line and/or the gate line.

The array substrate further include a pixel electrode 15 arranged and isolated from the first conductive layer 16 and the second conductive layer 17.

The first conductive structure 16 and the second conductive structure 17 are made of the same conductive material as the pixel electrode 15.

In the present embodiment, the first conductive structure 16 and the second conductive structure 17 are isolated from the pixel electrode 15, that is, the first conductive structure 16, the second conductive structure 17 are not electrically connected with the pixel electrode 15, directly or indirectly, so that the charges discharged by the first conductive structure 16 and the second conductive structure 17 will not enter the pixel electrode 15, avoiding interference on the display of the pixel electrode.

In addition, each of the first conductive structure 16 and the second conductive structure 17 can be a structure formed of any conductive material, and in the present embodiment, a same conductive material is used to form the first conductive structure 16, the second conductive structure 17 and the pixel electrode 15, facilitating to form these structures. One patterning process can be used to form the pixel electrode 15, the first conductive structure 16 and the second conductive structure 17 on the passivation layer.

Generally, the pixel electrode 15 is made from ITO (Indium Tin Oxide, a transparent conductive material). When making the pixel electrode 15, ITO is deposited on the whole pixel or the whole substrate, and then the useful portion is left by etching the ITO. But in the present embodiment, the first conductive structure and the second conductive structure are made of the same material as the pixel electrode, the discarded ITO is recycled, and neither the cost is increased, nor additional process is required. So, the array substrate according to the present application has advantages of easiness and being cost-efficient.

Third Embodiment

As illustrated in FIG. 3, the present embodiment further simplifies the arrangement of the first conductive structure 16.

The TFT comprises at lease the source/drain electrode layer which is divided into a drain electrode 11 and a source electrode 12; and a passivation layer 13 disposed on the source/drain electrode layer.

The first conductive structure 16 is disposed on the passivation layer 13, which is a protection layer for the source/drain electrode layer, and is also an insulation layer at the same time. By providing the first conductive structure 16 on the passivation layer 13, the charges in the first conductive structure 16 is prevented from entering the source electrode 12 and the drain electrode 11 and interfering operation of the TFT. The size of the first conductive structure 16 can be larger than the size of the TFT, and can also be smaller than the size of the TFT. In the structure illustrated in FIG. 3, the size of the first conductive structure is larger than the size of the TFT.

The second conductive structure 17 is disposed on the passivation layer and above the data line and/or gate line, ensuring the second conductive structure 17 to be isolated from the data line 18 or the gate line 19, and preventing the charges discharged from the second conductive structure 17 from interfering the data line 18 and the gate line 19. Similarly, the width of the second conductive structure 17 can be larger than the width of the data line 18 or the gate line 19, and can also be smaller than the width of the data line 18 or the gate line 19. When providing the second conductive structure 17, it can be connected to e.g. a ground terminal 20 of the array substrate so as to discharge the charges, and thus preventing the charges from accumulating between the spacer 30 and the TFT, generating an electro-static field and resulting in a press spot.

Figure 4:
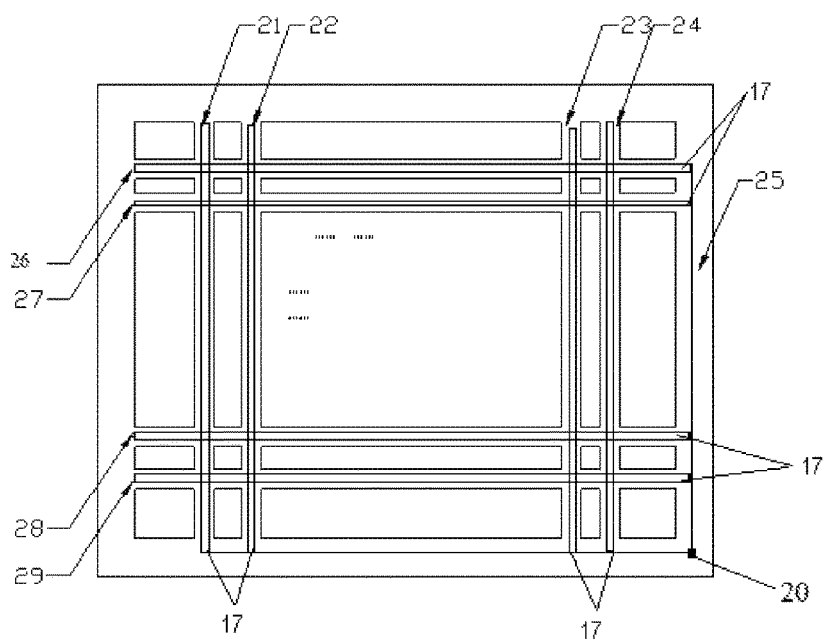
FIG. 4 is a schematic structural view illustrating the charge release network formed in the array substrate according to the present disclosure.

FIG. 4 illustrates a charge release network formed by the second conductive structure 17. As illustrate in FIG. 4, reference signs 21, 22, 23 and 24 refer to charge release rows of the charge release network, and reference signs 26, 27 28, and 29 refer to charge release columns of the charge release network, wherein the charge release rows are disposed insulatedly in a region corresponding to the data lines, and the charge release columns are disposed insulatedly in a region corresponding to the gate lines. Reference sign 25 refers to a periphery charge release region where the charge release rows connected with the charge release columns. The periphery charge release region is typically disposed in the periphery of the display area, so as to release charge.

In the array substrate of the present embodiment, by providing the first conductive structure 16 and the second conductive structure 17, a static electrical field generated due to accumulation of charges which are generated by friction between the spacer and the array substrate is prevented. Thus, great shutdown current between the source electrode and the drain electrode is avoided after the TFT is turned off, and press spot is eliminated.

Fourth Embodiment

The present embodiment provides a display device comprising an array substrate as described in any one of the first to third embodiments. The display device can be any product or component having display function, for example, a liquid crystal panel, an electronic paper, an OLED panel, a liquid crystal television, a liquid crystal monitor, a digital photo frame, a cell phone, a tablet PC, and the like.

Further, the display device can further comprise an opposite substrate 2 provided opposing the array substrate and the spacer 30 provided between the array substrate and the opposite substrate.

At least a portion of the spacer 30 is provided opposing the first conductive structure. The opposite substrate and the array substrate are provided a plurality of spacers therebetween, and at least some of the spacers 30 is provided opposing to the first conductive structure.

When the display device is a liquid crystal panel, the opposite substrate 2 can be a color film substrate, and the spacers 30 are spacers having a shape of post and separately provided on the liquid crystal layer, which are used for connection and support between the color film substrate and the array substrate. When the array substrate of the display device is provided with a color film sheet thereon, the opposite substrate can be a transparent substrate.

When the display device is an OLED panel, the opposite substrate 2 can also be a color film substrate, and the spacers 30 are provided on support components between the OLED materials.

In the real design, the spacers 30 can be classified as main spacers functioning as main support and sub-spacers functioning as subsidiary support. Depending on a size of the panel and requirement on the minimum deformation, only the pixels provided opposite to the main spacers are provided as the array substrate described in the embodiments of the present disclosure, or pixels provided opposite to any of the spacers are provided as the array substrate described in the embodiments of the present disclosure, or all the pixels in the array substrate are provided as the array substrate described in the embodiments of the present disclosure.

When the display device according to the present embodiment is subjected to external force such as knocking, pressing, pinching, etc., the spacer 30 will prevent the display device from excessively deformation. Meantime, when charges are generated due to the abrasion between the spacer and the first conductive structure, the charges can be discharged through the first conductive structure itself and the second conductive structure in time, and thus formation of press spots is effectively suppressed, performance of the display device is improved, and yield rate of the display device is improved.

Fifth Embodiment

The method for manufacturing the array substrate according to the present embodiment comprises: step 2 of forming patterns comprising the TFT, the data line, the gate line and the passivation layer on the substrate and step 3.

The step 3 is a step for forming a pattern of the first conductive structure on the passivation layer and above the TFT, forming a pattern of the second conductive structure on the passivation layer and above the data line and/or gate line, and connecting the first conductive layer with the second conductive layer.

Compared with conventional methods for manufacturing the array substrate, the method for manufacturing the array substrate according to the present disclosure comprises the steps of forming the first conductive structure on the passivation layer and above the TFT and forming the second conductive structure on the passivation layer and above the data line and/or gate line, it is possible for the array substrate made by this method to avoid formation of press spots generated due to the abrasion between the spacers and the array substrate.

The step 3 comprises:

Step 301: depositing a layer of conductive material on the passivation layer;

Step 302: forming patterns comprising the first conductive structure and the second conductive structure from the conductive material above the TFT through a patterning process; the first conductive structure being connected with the second conductive structure.

For example, the patterning process employed can be a process such as photoresist coating, exposure, development, etching, photoresist peeling off, and so on.

The pixel electrode is provided and isolated from the first conductive structure and the second conductive structure.

For example, the first conductive structure and the second conductive structure in the array substrate are connected with each other to form a charge discharge grid structure, as illustrated in FIG. 3, for discharging the charges generated due to the abrasion between the spacers and the TFT.

In the present embodiment, the first conductive structure and the second conductive structure are the conductive structures made of the same material as the pixel electrode, thus deposition of the conductive structures corresponding to the first conductive structure and the second conductive structure can be performed at the same time as deposition of the pixel electrode, and forming the first conductive structure and the second conductive structure may be performed at the same time as etching the pixel electrode. Compared to the conventional methods for manufacturing the array substrate, no additional material or process is added. The method according to the present disclosure can be easily performed and easily to be implemented. In this method, the waste conductive structure (the conductive structure can be ITO) in the conventional methods for manufacturing the array substrate can be recycled to form the first conductive structure and the second conductive structure, thus resource is saved. The array substrate made by the method according to the present disclosure has the advantages of simple structure, easy to be made, and so on. Meantime, the array substrate made by this method has less press spot, high product quality, and is especially suitable to make the pixels for the big-size and slim display device.

The foregoing are merely exemplary embodiments of the disclosure, but are not used to limit the protection scope of the disclosure. Those skilled in the art can make various modifications and variants without departing the spirit and the protection scope of the present disclosure. The protection scope of the disclosure shall be defined by the attached claims.

The invention claimed is:

1. An array substrate comprising a thin film transistor, a data line, a gate line and a passivation layer) disposed thereon, wherein the TFT comprises a gate electrode, a source electrode and a drain electrode, the data line is connected to the source electrode of the TFT, the gate line is connected to the gate electrode of the TFT, and the passivation layer covers the TFT, the data line and the gate line, and wherein the array substrate further comprises a first conductive structure and a second conductive structure connected with the first conductive structure, the first conductive structure is disposed in a display area of the array substrate and on the passivation layer and above the TFT, the second conductive structures disposed on the passivation layer and above at least one of the data line and the gate line.

2. The array substrate according to claim 1, wherein the first conductive structure is connected to a ground terminal on the array substrate through the second conductive structure.

3. The array substrate according to claim 2, wherein the first conductive structure and the second conductive structure comprise the same material as that of the pixel electrode.

4. The array substrate according to claim 2, wherein each of the first conductive structure, the second conductive structure and the pixel electrode is made of ITO.

5. The array substrate according to claim 2, wherein the array substrate further comprises a pixel electrode provided on the passivation layer.

6. The array substrate according to claim 2, wherein the second conductive structure forms a charge discharge grid comprising a discharge row and a discharge column, and the discharge row is provided insulatedly in the region corresponding to the data line, and the discharge columns are provided insulatedly in the region corresponding to the gate line.

7. The array substrate according to claim 1, wherein the array substrate further comprises a pixel electrode provided on the passivation layer.

8. The array substrate according to claim 7, wherein, the pixel electrode is provided and isolated from the first conductive structure and the second conductive structure.

9. The array substrate according to claim 8, wherein the pixel electrode, the first conductive structure and the second conductive structure are formed through one patterning process.

10. The array substrate according to claim 7, wherein the pixel electrode, the first conductive structure and the second conductive structure are formed through one patterning process.

11. The array substrate according to claim 7, wherein the first conductive structure and the second conductive structure comprise the same material as that of the pixel electrode.

12. The array substrate according to claim 7, wherein each of the first conductive structure, the second conductive structure and the pixel electrode is made of ITO.

13. The array substrate according to claim 7, wherein the second conductive structure forms a charge discharge grid comprising a discharge row and a discharge column, and the discharge row is provided insulatedly in the region corresponding to the data line, and the discharge columns are provided insulatedly in the region corresponding to the gate line.

14. The array substrate according to claim 1, wherein the second conductive structure forms a charge discharge grid comprising a discharge row and a discharge column, and the discharge row is provided insulatedly in the region corresponding to the data line, and the discharge columns are provided insulatedly in the region corresponding to the gate line.

15. A display device comprising the array substrate according to claim 1.

16. The display device according to claim 15, wherein the display device further comprises an opposite substrate provided opposing the array substrate, and a spacer provided between the opposite substrate and the array substrate, and
  at least a portion of the spacer is provided opposing to the first conductive structure.

\* \* \* \* \*